United States Patent [19]

Tabei

[11] Patent Number: 4,870,494
[45] Date of Patent: Sep. 26, 1989

[54] SOLID STATE IMAGE PICKUP DEVICE HAVING A DIFFERENT SIGNAL CHARGE TRANSFER SPEEDS FOR PHOTOGRAPHIC OPERATIONS AND FOR PRELIMINARY PHOTOMETRIC OPERATIONS, AND METHOD OF PROVIDING THE SAME

[75] Inventor: Masatoshi Tabei, Kanagawa, Japan

[73] Assignee: Fuji Photo Film Co., Ltd., Kanagawa, Japan

[21] Appl. No.: 234,873

[22] Filed: Aug. 22, 1988

[30] Foreign Application Priority Data

Aug. 20, 1987 [JP] Japan ................................. 62-204986

[51] Int. Cl.$^4$ ............................................. H04N 3/14
[52] U.S. Cl. .................................. 358/213.19; 358/228
[58] Field of Search ..................... 358/213.19, 213.22, 358/213.26, 909, 228

[56] References Cited

U.S. PATENT DOCUMENTS

| | | | |
|---|---|---|---|
| 4,396,950 | 8/1983 | Roth | 358/213.19 |
| 4,442,457 | 4/1984 | Pines | 358/213.26 |
| 4,594,612 | 6/1986 | Levine | 358/213.26 |
| 4,644,405 | 2/1987 | Roy et al. | 358/213.26 |
| 4,679,090 | 7/1987 | Erhardt | 358/213.26 |
| 4,689,686 | 8/1987 | Hashimoto et al. | 358/213.19 |

Primary Examiner—Jin F. Ng
Assistant Examiner—Stephen Brinich
Attorney, Agent, or Firm—Sughrue, Mion, Zinn, Macpeak & Seas

[57] ABSTRACT

A solid-state image pickup device for an electronic camera or the like in which the total picture-taking time is reduced by reducing the time required for performing photometric measurements, which are a necessary preliminary to the actual photographing operation. The light detecting elements of the pickup device are read out for purposes of the photometric measurements at a rate an integer multiple of the rate employed for the ordinary photographing operation.

9 Claims, 5 Drawing Sheets

SOLID STATE IMAGE PICKUP DEVICE HAVING A DIFFERENT SIGNAL CHARGE TRANSFER SPEEDS FOR PHOTOGRAPHIC OPERATIONS AND FOR PRELIMINARY PHOTOMETRIC OPERATIONS, AND METHOD OF PROVIDING THE SAME

BACKGROUND OF THE INVENTION

An example of a conventional solid-state image pickup device is shown in FIG. 4. FIG. 4 is a top view of a part of a light detecting region in the solid-state image pickup device, which may be a charge storage device of the interline transfer type, showing the basic structure of the solid-state image pickup device. A plurality of n-type layers are formed in matrix arrangement in a p-type silicon layer (p-well) formed on the surface of a semiconductor substrate, thus providing a plurality of light detecting elements (photodiodes) $Pd_{11}$, $Pd_{12}$, ..., $Pd_{21}$, $Pd_{22}$, ... A plurality of charge transfer channels $L_1$, $L_2$, $L_3$, ... are formed between the photodiodes in columns to transfer signal charges in a vertical direction. The regions (shown surrounded by dotted lines and shaded by oblique lines in the drawing) except for those of the photodiodes and the charge transfer channels $L_1$, $L_2$, $L_3$, ... are channel stop regions.

A plurality of transfer electrodes $G_1$, $G_2$, $G_3$, $G_4$, ... formed of polysilicon layers extend horizontally over the charge transfer channel. With four transfer electrodes as one group, clock signals $\phi_1$, $\phi_2$, $\phi_3$, and $\phi_4$ generated according to a four-phase drive system are applied to the transfer electrodes (G). More specifically, two transfer electrodes $G_1$ and $G_2$ are formed for the line of photodiodes $Pd_{11}$, $Pd_{12}$, ..., two transfer electrodes $G_3$ and $G_4$ are formed for the line of photodiodes $Pd_{21}$, $Pd_{22}$, ..., and so on for the remaining lines (not shown). Potential wells are formed in the charge transfer channels $L_1$, $L_2$, $L_3$, ... according to the variations in voltage of the clock signals $\phi_1$, $\phi_2$, $\phi_3$ and $\phi_4$, so that signal charges generated by the photodiodes are transferred in the output direction Y. The photodiodes are connected to the charge transfer channels $L_1$, $L_2$, $L_3$, ... through transfer gates $Tg_{11}$, $Tg_{12}$, ..., and are turned on by application of a predetermined high voltage to the transfer electrodes $G_2$, $G_4$, ....

The charge transfer operation according to the four-phase drive system will be described with reference to FIGS. 5 and 6. FIG. 5 is a sectional view taken along line X—X in FIG. 4, showing relationships between the transfer electrodes $G_1$, $G_2$, $G_3$, $G_4$, ... and the potential wells. The photodiodes (Pd) and the transfer electrodes (G) are combined in such a manner that, for instance, the photodiode group $Pd_{12}$ and the transfer electrodes $G_1$ and $G_2$ are arranged in an odd-numbered row, and the photodiode group $Pd_{22}$ and the transfer electrodes $G_3$ and $G_4$ are in an even-numbered row, in which case a set of signal charges can be transferred with four transfer electrodes as one group.

The transfer operation will be described in detail with reference to the potential profile shown in FIG. 6. When, for instance, at the time instant $t_0$, the voltage levels of the signals $\phi_1$, $\phi_2$, $\phi_3$ and $\phi_4$ are set to "L", "H", "H" and "H", respectively, the signal charges generated by the photodiodes $Pd_{12}$ and $Pd_{22}$ in the odd-numbered and even-numbered rows can be transferred to the potential well as shown in FIG. 6. When, at the next time instant $t_1$, the voltage levels of the clock signals $\phi_1$, $\phi_2$, $\phi_3$ and $\phi_4$ are set to "L", "L", "H" and "H", respectively, a potential barrier is formed under the transfer electrode to which the clock signal $\phi_2$ is applied, and therefore the signal charges are shifted in the transfer direction. In succession, the voltage levels of the clock signals $\phi_1$, $\phi_2$, $\phi_3$ and $\phi_4$ are set "H", "H", "L" and "H", respectively, at the time instant $t_4$ to transfer the signal charges. Thus, the transfer operation is achieved using the above-described four phases of the potential profile.

However, the above-described solid-state image pickup device suffers from the following problems: In the case where the solid-state image pickup device is applied to an image pickup device such as an electronic camera, it is essential to determine various photographing factors such as exposure, focus and white balance before an actual photographing operation. The time required for this process before the photographing operation is relatively long since recent image pickups employ a high picture element density. Therefore, the operator may consider that the camera is relatively slow in operation.

For instance, in the adjustment of white balance in an electronic camera employing a TTL system, first, incident light from the object is converted into a video signal with a solid-state image pickup device, then a luminance signal and color signals are derived from the video signal. Next, the amplification factors of amplifiers for amplifying these color signals are adjusted by feeding back the color signals so that they correspond to the reference "white". Similarly, lengthy processing must be carried out for exposure setting and focussing. Only when all of these operations have been completed can photographing operations be carried out in the ordinary manner.

To achieve the above-described adjustments, all signal charges generated by all the light detecting elements in the matrix are read, and these signals are processed. In order to accomplish the adjustment with high accuracy, the signal reading operation must be carried out at least several times. Therefore, the time required for all processes preparatory to the actual photographing operation is considerably long. Concretely stated, the time required for reading signal charges for one frame is generally 1/30 second, and accordingly for ten repetitions the total time is ⅓ second. Since the signal processing time must be added to this time to determine the total picture-taking interval, which time may even be longer, the total picture-taking interval is so long as to adversely affect the operability and performance of the camera.

SUMMARY OF THE INVENTION

In view of the above-described problems, an object of this invention is to provide a solid-state image pickup device in which the signal charge transfer speed is increased.

The foregoing and other objects of the invention have been achieved by the provision of a solid-state image pickup device comprising: a plurality of light detecting elements arranged in rows and columns; charge transfer channels provided between ones of the light detecting elements in each of the rows; a set of charge transfer electrodes for effecting charge transfer along the rows; means for supplying a set of multi-phasic clock signals for driving the charge transfer electrodes; and switching means for applying the clock signals to the charge transfer electrodes in a selectable one of first and second patterns, that is, first and second combinations of connections of the multi-phasic clock signals and the charge transfer electrodes, the second pattern yielding a total reading time of the pickup device 1/n times a total reading time for the first pattern and a resolution 1/n times a resolution for the first pattern, n being a positive integer.

The foregoing and other objects of the invention have also been achieved by the provision of a solid-state image pickup device in which signal charges are transferred through charge storage type charge transfer paths with the aid of clock signals provided using an m-phase drive system which, according to the invention, comprises: a first signal line group consisting of m signal lines for applying the clock signals; a second signal line group consisting of m×n signal lines arranged to cross the signal lines of the first signal line group to provide n times a transfer speed; first switching means for simultaneously switching the signal lines of the second signal line group, with n signal lines as one unit, with respect to each of the signals lines of the first signal line group; second switching means for simultaneously switching the signal lines of the second signal line group, with m signal lines as one unit, with respect to each of the signal lines of the first signal line group, the first and second switching means being provided at intersections of the signal lines of the first and second signal line groups; and a switch control device for operating the first and second switching means alternately and exclusively.

The invention thus allows the preliminary photometric operations an electronic camera to be effected more quickly than in conventional cameras, thereby reducing the total picture-taking time significantly.

That is, the invention further provides a method for operating an electronic camera, comprising the steps of: reading out charges from a solid-state image pickup device at a first rate and first resolution for effecting predetermined photometric measurements prior to an actual photographing operation; and reading out charges from the solid-state image pickup device at second rate slower than the first rate and a second resolution greater than the first resolution for an actual photographing operation.

DESCRIPTION OF THE PREFERRED EMBODIMENTS

Figure 1:
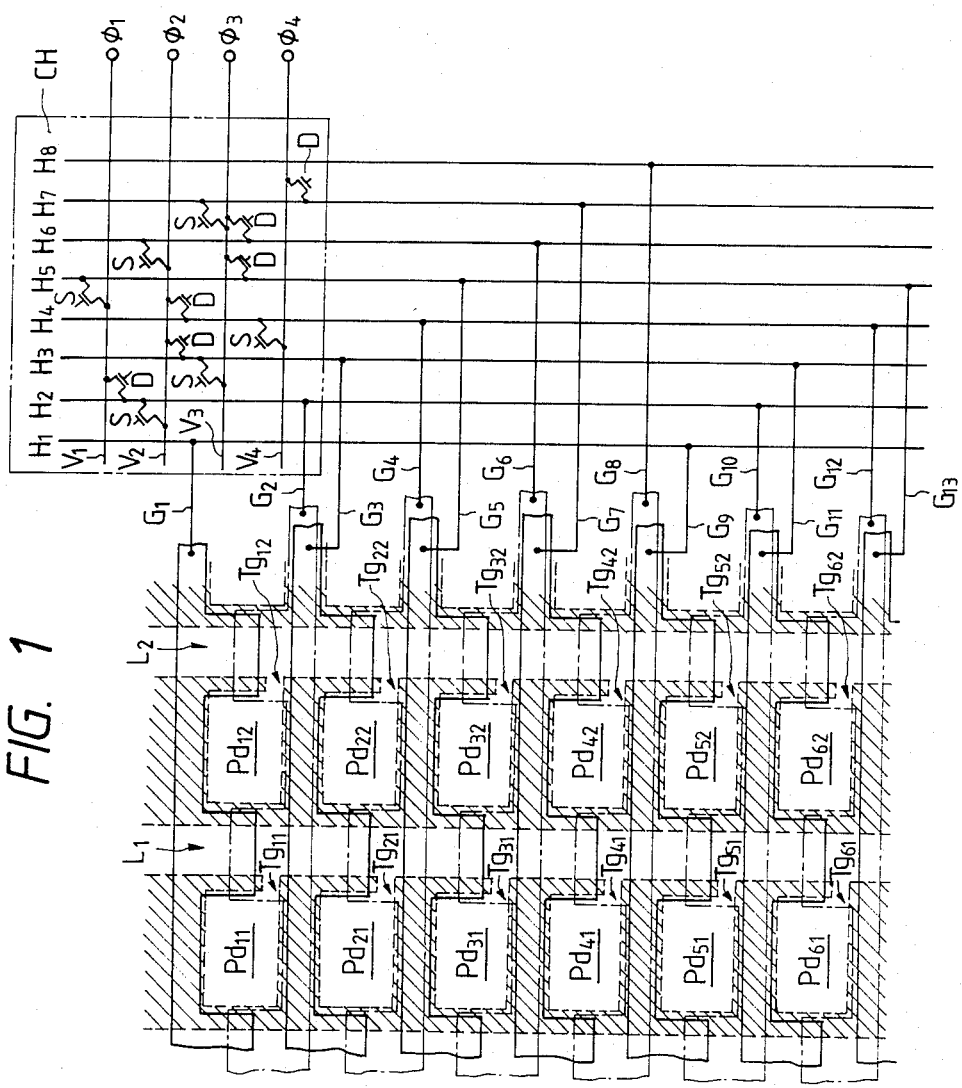
FIG. 1 is an explanatory diagram showing the arrangement of a first example of a solid-state image pickup device constructed according to the present invention.
Figure 4:
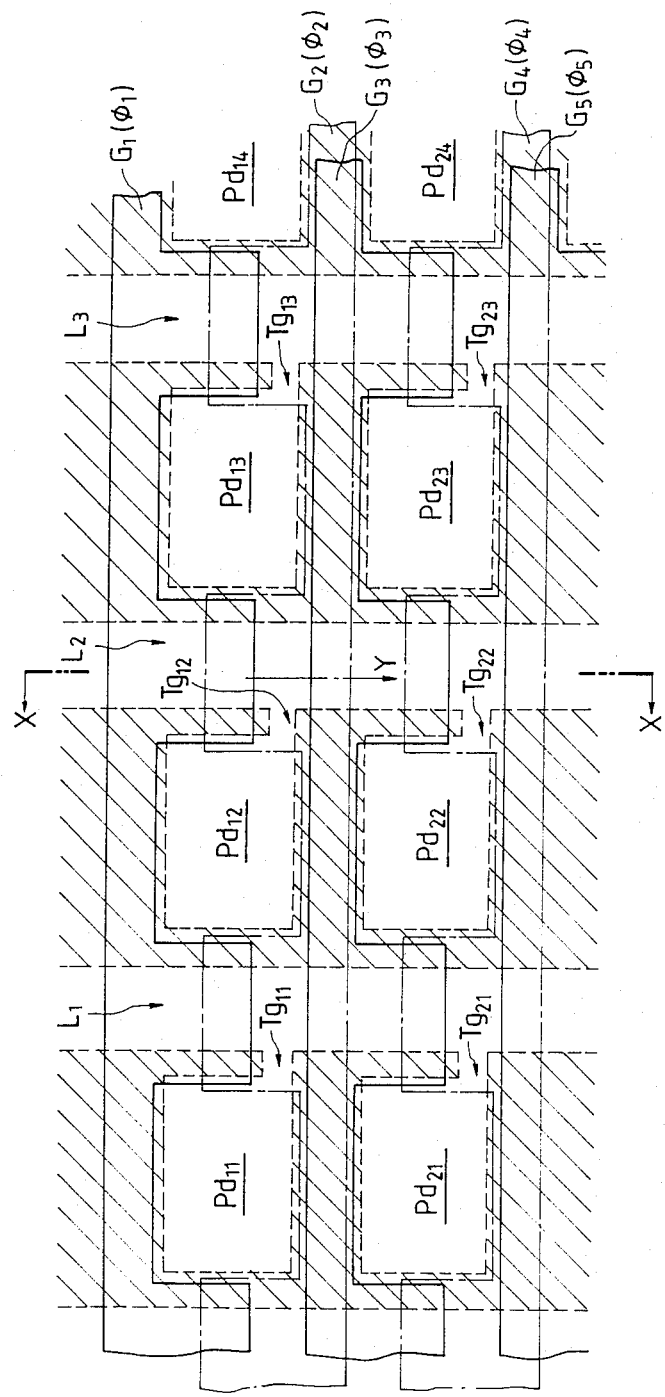
FIG. 4 is a plan view showing essential components in the light detecting region of a conventional solid-state image pickup device.
Figure 5:
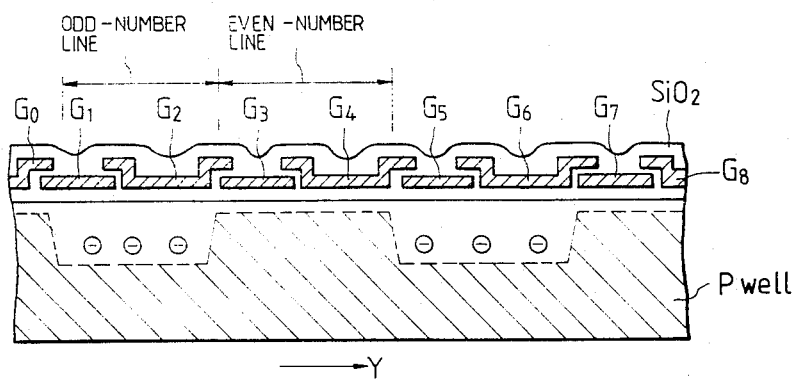
FIG. 5 is a sectional view taken along a line X—X in FIG. 4.

An example of a solid-state image pickup device constructed according to the invention will be described with reference to FIG. 1, which shows a part of the light detecting region in the device. In FIG. 1, those components which have been already described with reference to FIG. 4 are therefore designated by the same reference numerals or characters.

A plurality of n-type layers are formed, in matrix arrangement, in a p-type silicon layer (p-well) formed on the surface of a semiconductor substrate, thus providing a plurality of light detecting elements (photodiodes) $Pd_{11}$, $Pd_{12}$, ..., $Pd_{22}$, .... A plurality of charge transfer channels $L_1$, $L_2$, ... are formed between the photodiodes in columns to transfer signal charges in the vertical direction. The regions (shown surrounded by the dotted lines and shaded by the oblique lines in this drawing) except for those of the photodiodes and the charge transfer channels $L_1$, $L_2$, ... are channel stop regions.

A plurality of transfer electrodes $G_1$, $G_2$, $G_3$, $G_4$, ... made of a polysilicon layer are juxtaposed over the charge transfer channels $L_1$, $L_2$, ... in such a manner that they extend in a horizontal direction. Clock signals $\phi_1$, $\phi_2$, $\phi_3$ and $\phi_4$ generated according to a four-phase drive system are applied to these transfer electrodes with four transfer electrodes as a group. More specifically, two transfer electrodes $G_1$ and $G_2$ are formed for the line of photodiodes $Pd_{11}$, $Pd_{12}$, ..., two transfer electrodes $G_3$ and $G_4$ are formed for the line of photodiodes $Pd_{21}$, $Pd_{22}$, ..., and so on for the remaining lines (not shown). Potential wells are formed in the charge transfer channels $L_1$, $L_2$, $L_3$, ... according to the variations in voltage of the clock signals $\phi_1$, $\phi_2$, $\phi_3$ and $\phi_4$, so that signal charges generated by the photodiodes are transferred in the output direction Y. The photodiodes are connected to the charge transfer channels $L_1$, $L_2$, $L_3$, ... through transfer gates $Tg_{11}$, $Tg_{12}$, ....

The four-phase clock signals $\phi_1$, $\phi_2$, $\phi_3$ and $\phi_4$ are supplied to the transfer electrodes $G_1$, $G_2$, $G_3$, $G_4$, ... through a switch control device CH (encircled by a two-dot chain line in FIG. 1) and signal lines $V_1$ through $V_4$. The eight signal lines $V_1$ through $V_8$ and the signal lines $V_1$ through $V_4$ cross each other in the switch control device CH, and MOS transistors S and D are connected between predetermined intersections. That is, when the transistors S are rendered conductive while the transistors D are rendered nonconductive, the signal $\phi_1$ is applied to the signal lines $H_1$ and $H_5$ through the signal line $V_1$, the signal $\phi_2$ to the signal lines $H_2$ and $H_6$ through the signal line $V_2$, the signal $\phi_3$ to the signal lines $H_3$ and $H_7$ through the signal line $V_3$, and the signal $\phi_4$ to the signal lines $H_4$ and $H_8$ through the signal line V. Thus, similarly to the case of FIG. 6, the four-phase clock signals $\phi_1$ through $\phi_4$ are applied to the transfer electrodes $G_1$ through $G_4$, $G_5$ through $G_8$, ...

When, on the other hand, the transistors S are rendered nonconductive while the transistors D are conductive, the signal $\phi_1$ is applied to the signal lines $H_1$ and $H_2$ through the signal line $V_1$, the signal $\phi_2$ to the signal lines $H_3$ and $H_4$ through the signal line $V_2$, the signal $\phi_3$ to the signal lines $H_5$ and $H_6$ through the signal line $V_3$, and the signal $\phi_4$ to the signal lines $H_7$ and $H_8$ through the signal line $V_4$. That is, the four-phase clock signals $\phi_1$, $\phi_2$, $\phi_3$ and $\phi_4$ are applied to pairs of adjacent transfer electrodes $G_1$ and $G_2$, $G_3$ and $G_4$, $G_5$ and $G_6$, $G_7$ and $G_8$, ....

Figure 2:
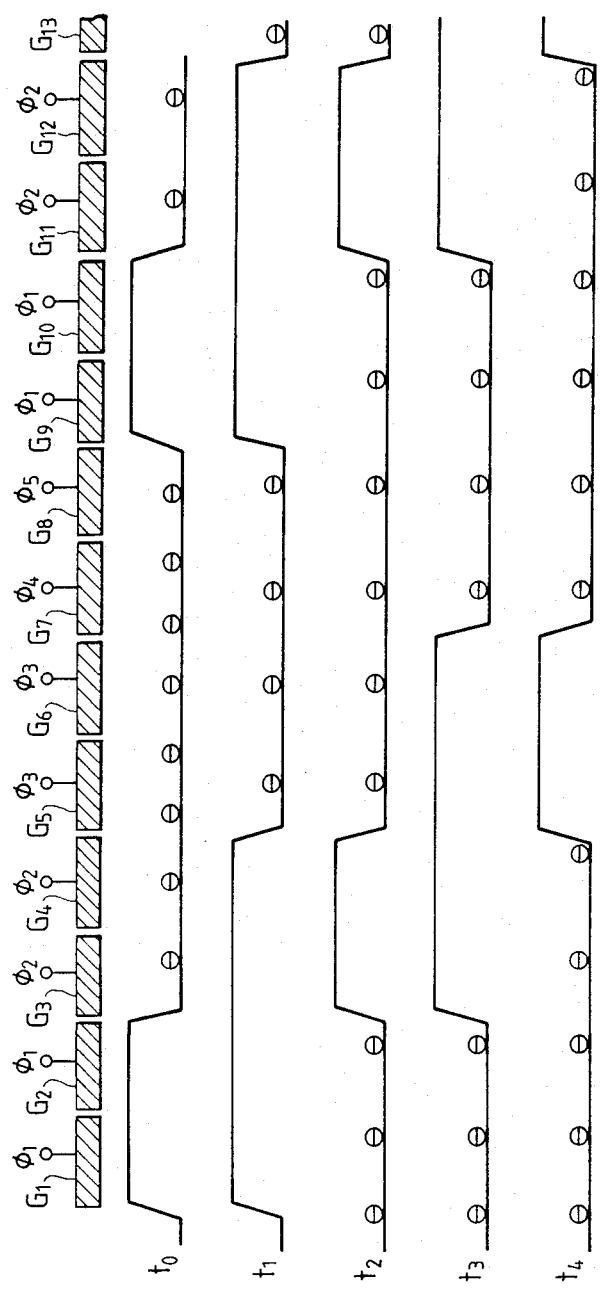
FIG. 2 is a potential profile diagram for a description of the operation of the solid-state image pickup device shown in FIG. 1.
Figure 6:
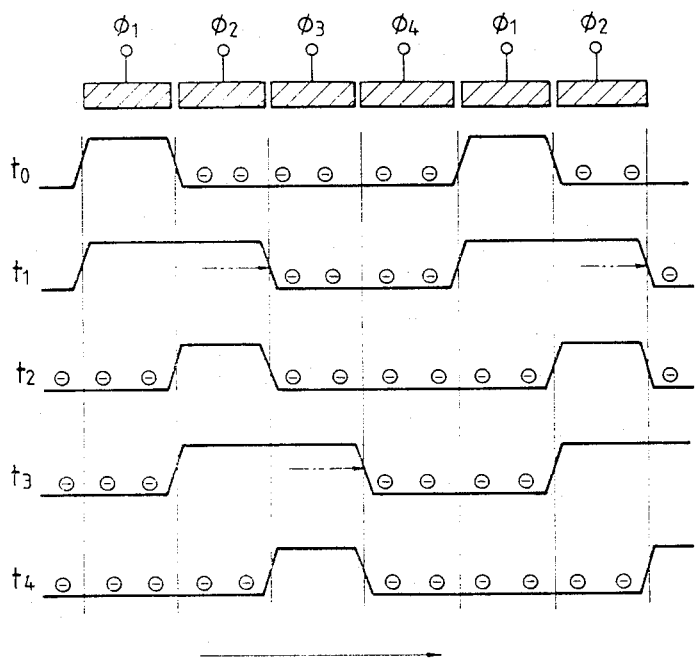
FIG. 6 is a potential profile diagram for a description of the operation of the light detecting region shown in FIG. 4.

Therefore, as is apparent from the potential profile shown in FIG. 2, the transfer speed is twice as fast as that in the conventional charge transfer (cf. FIG. 6). That is, in the conventional charge transfer shown in FIG. 6, in order to perform odd-numbered field signal charge transfer, the level of the clock signal $\phi_2$ is set to a high voltage for a predetermined period of time so that the transfer gates $Tg_{11}$, $Tg_{12}$, ..., $Tg_{31}$, $Tg_{32}$, ... are rendered open (on), as a result of which the charges are transferred from the photodiodes $Pd_{11}$, $Pd_{12}$, ..., $Pd_{31}$, $Pd_{32}$, ..., $Pd_{51}$, $Pd_{52}$, ... to the charge transfer elements under the transfer electrodes $G_2$, $G_6$, $G_{10}$, .... Under this condition, charge transfer is carried out as shown in FIG. 6. The above description is applicable as well to even-numbered field signal charge transfer.

On the other hand, in accordance with the present invention, control is made with the similar clock signals $\phi_1$ through $\phi_4$, and when the transistors S are nonconductive and the transistors D conductive, the clock signal $\phi_2$ is set to a high voltage so that the transfer gates $Tg_{11}$, $Tg_{12}$, ..., $Tg_{51}$, $Tg_{52}$, ... are rendered open (on), as result of which the charges are transferred from the photodiodes $Pd_{11}$, $Pd_{12}$, ..., $Pd_{51}$, $Pd_{52}$, ... to the charge transfer elements under the transfer electrode pairs $G_2$ and $G_3$, $G_{10}$ and $G_{11}$, etc. Therefore, in the case where an odd-numbered field signal reading operation is carried out, the charges of the photodiodes $Pd_{31}$, $Pd_{31}$, ... are not read out. In an even-numbered field signal reading operation, as in the above-described odd-numbered field signal reading operation, a so-called "curtailed" operation is carried out.

As is apparent from the above description, when the transistors S in the switch control device CH are rendered nonconductive while the transistors D are conductive, half the number of signal charges are read out, which can be done at a speed twice as fast. Therefore, the resulting faster determination of photometric factors such as exposure and white balance according to the video signal thus read greatly increases the processing speed.

After these photometric factors have been determined, in the switch control device CH the states of the transistors S and D are changed, that is, the transistors S are rendered conductive whereas the transistors D are rendered nonconductive, and under this condition a signal reading operation for an ordinary photographing operation is carried out. The video signal used in the determination of the photometric factors is lower in resolution than that read out in the ordinary photographing operation; however, practically this causes no problems in operation because high resolution is not required for determination of the photometric factors.

In the above-described embodiment, for application of the four-phase drive system clock signals, the connection of the four signal lines $V_1$ through $V_4$ and the eight signal lines $H_1$ through $H_8$ are changed in the switch control device CH. A general description of the switch control device follows.

A first group of m signal lines (corresponding to $V_1$ through $V_4$ in the above description) for application of m-phase drive system clock signals, and a second group of m×n signal lines (corresponding to $H_1$ through $H_8$ in the above description), where n is the transfer speed magnification (in the above description n = 2 because the transfer speed becomes twice as fast) are arranged as shown in FIG. 1. Switching devices for simultaneously connecting the first (corresponding to $V_1$ in FIG. 1) of the first group of signal lines to n signal lines beginning from the first signal line (corresponding to $H_1$ and $H_2$ in FIG. 1) in the second group of signal lines are provided, switching devices for simultaneously connecting the second (corresponding to $V_2$ in FIG. 1) of the first group of signal lines to the (n+1)-th through the 2n-th signal lines (corresponding to $H_3$ and $H_4$ in FIG. 1) are provided, and similarly switching devices (corresponding to D in FIG. 1) for connecting the i-th of the first group of signal lines to the (2- 1)-th through i×n-th of the second group of signal lines are provided.

Figure 3:
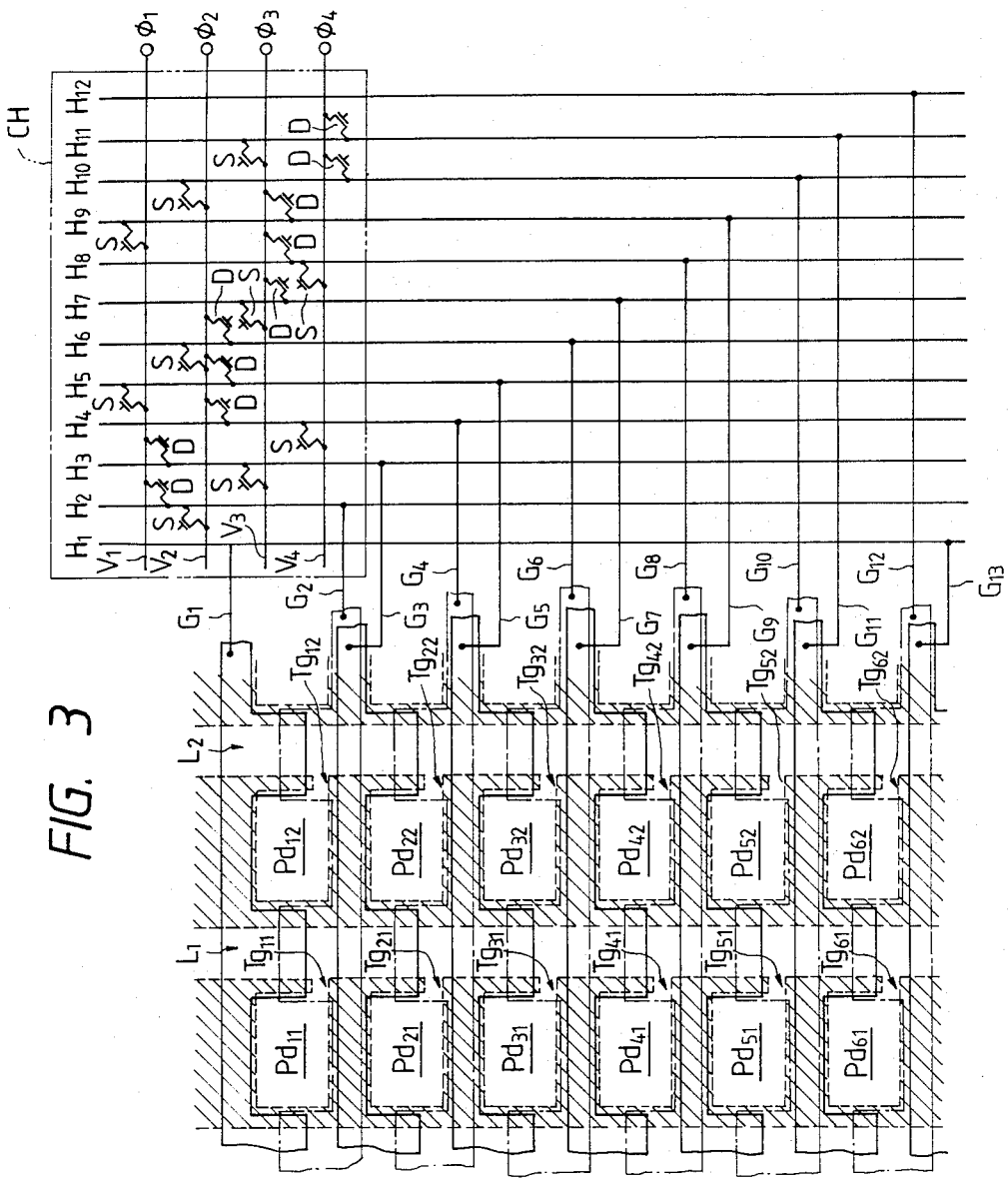
FIG. 3 is an explanatory diagram showing the arrangement of a second example of a solid-state image pickup device according to the invention.

Another embodiment of the invention will be described with reference to FIG. 3. In the embodiment of FIG. 3, the transfer speed is increased three-fold with the four-phase clock signals. As shown in FIG. 4, the number (m) of signal lines in the first group is four (m=4), the number (m×n) of signal lines in the second group is twelve (m×n=4×3=12), and switching devices D are provided for connecting the signal lines in the first group to the signal lines in the second group with three signal lines as one unit. It goes without saying that, in order to read video signals at the ordinary charge transfer speed, switching devices S for applying the clock signals are provided for the signal lines in the second group, and the switching devices D and S are operated alternately and exclusively. In FIGS. 1 and 3, at the first and last of the intersections of the first and second group of signal lines, the signal lines $H_1$ and $V_1$, $H_8$ and $V_4$, and $H_{12}$ and $V_4$ are directly connected. That is, both in the case where the transfer speed is made n times as fast and in the case where the ordinary transfer speed is employed, the same clock signals are applied, and therefore at those intersections the signal lines are connected directly without the transistors S and D. Accordingly, the same effect is substantially obtained by providing the transistors S and D at those intersection.

In the case where it is required to form a color solid-state image pickup device by laminating a color filter over the light detecting region as shown in FIG. 1 or 3, it is preferable to provide the same color filter for every line of photodiodes as viewed in the charge transfer direction; that is, it is preferable to employ a so-called stripe filter. This is because if, for instance, a Bayer arrangement is employed, then a color mixing phenomenon occurs when the charge transfer speed is increased.

As described above, the solid-state image pickup device in which signal charges are transferred through charge storage type charge transfer paths with the aid of clock signals in an m-phase drive system, according to the invention, comprises: the first signal line group consisting of m signal lines for applying the clock signals; the second signal line group consisting of m×n signal lines arranged to cross the signal lines of the first signal line group to provide a transfer speed increased by a factor of n; first switching devices for simultaneously switching signal lines of the second signal line group with n signal lines as one unit with respect to each of the signal lines of the first signal line group; the second switching means for simultaneously switching the signal lines of the second signal line group, with m signal lines as one unit, with respect to each of the signal lines of the first signal line group, the first and second switching devices being provided at intersections of the signal lines of the first and second signal line groups;

and a switch control device for operating the first and second switching devices alternately and exclusively.

With this arrangement, both an ordinary charge transfer speed and a charge transfer speed n times as fast can be selected by switching. In an image pickup utilizing device such as an electronic camera, the time required for operations such as the determination of the various photometric factors can thus be greatly reduced by employing the multiplied charge transfer speed for photometric operations preliminary to the actual photographing operation.

What is claimed is:

1. A solid-state image pickup device adapted to have different charge transfer rates for actual photographic operations and for preliminary photometric operations, said device comprising:
   a plurality of light detecting elements arranged in rows and columns;
   charge transfer channels provided between ones of said light detecting elements in each of said rows;
   a set of charge transfer electrodes for effecting charge transfer along said rows;
   means for supplying a set of multi-phasic clock signals for driving said charge transfer electrodes; and
   switching means for applying said clock signals to said charge transfer electrodes in a selectable one of first and second patterns for actual photographic operations and for preliminary photometric operations, respectively, said second pattern yielding a total reading time of said pickup device 1/n times a total reading time for said first pattern and a resolution 1/n times a resolution for said first pattern, n being a positive integer.

2. A solid-state image pickup device comprising:
   a plurality of light detecting elements arranged in rows and columns;
   charge transfer channels provided between ones of said light detecting elements in each of said rows;
   a set of charge transfer electrodes for effecting charge transfer along said rows;
   means for supplying a set of multi-phasic clock signals for driving said charge transfer electrodes; and
   switching means for applying said clock signals to said charge transfer electrodes in a selectable one of first and second patterns, said second pattern yielding a total reading time of said pickup device 1/n times a total reading time for said first pattern and a resolution 1/n times a resolution for said first pattern, n being a positive integer;
   wherein said means for supplying said set of multi-phasic clock signals comprises a first set of signal lines each carrying one of said multi-phasic clock signals, and wherein said switching means comprises a second set of signal lines crossing said first set of signal lines each being connected to predetermined ones of said charge transfer electrodes, said second set of signal lines being in number n times the number of said first set of signal lines, and first and second sets of switching transistors coupled between predetermined ones of said first and second sets of signal lines for connecting said multi-phasic clock signals to said transfer electrodes in said first and second patterns, respectively.

3. A solid-state image pickup device in which signal charges are transferred through charge storage type charge transfer paths with the aid of clock signals generated in an m-phase drive system, comprising:
   a first signal line group consisting of m signal lines for applying said clock signals;
   a second signal line group consisting of m×n signal lines arranged to cross said signal lines of said first signal line group to provide n times a transfer speed;
   first switching means for simultaneously switching said signal lines of said second signal line group with n signal lines as one unit with respect to each of said signal lines of said first signal line group;
   second switching means for simultaneously switching said signal lines of said second signal line group with m signal lines as one unit with respect to each of said signal lines of said first signal line group, said first and second switching means being provided at intersections of said signal lines of said first and second signal line groups; and
   a switch control device for operating said first and second switching means alternately and exclusively.

4. The solid-state image pickup device of claim 3, wherein n is 2.

5. The solid-state image pickup device of claim 3, wherein n is 3.

6. A method for operating an electronic camera, comprising the steps of:
   reading out charges from a solid-state image pickup device at a first rate and first resolution for effecting predetermined photometric measurements prior to an actual photographing operation; and
   reading out charges from said solid-state image pickup device at second rate slower than said first rate and a second resolution greater than said first resolution for an actual photographing operation.

7. The method for operating an electronic camera of claim 6, wherein said first rate is twice said second rate and said first resolution is half second resolution.

8. The method for operating an electronic camera of claim 6, wherein said first rate is three times said second rate and said first resolution is one-third said second resolution.

9. The method for operating an electronic camera of claim 6, wherein said step of reading out charges from said solid-state image pickup device at a first rate and first resolution comprises applying multi-phasic clock signals to charge transfer electrodes of said solid-state image pickup device in a first pattern and said step of reading out charges from said solid-state image pickup device at a second rate and second resolution comprises applying said multi-phasic clock signals to said charge transfer electrodes in a second pattern.

* * * * *